(12) United States Patent
Hietala et al.

(10) Patent No.: US 7,457,586 B1
(45) Date of Patent: Nov. 25, 2008

(54) METHOD OF IN-DEVICE PHASE MEASUREMENT AND CORRELATION TO PROGRAMMABLE FACTORS

(75) Inventors: Alexander Wayne Hietala, Phoenix, AZ (US); Adam Walter Toner, Kernersville, NC (US); David Durgin Coons, Greensboro, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 435 days.

(21) Appl. No.: 11/151,023

(22) Filed: Jun. 13, 2005

Related U.S. Application Data

(60) Provisional application No. 60/661,957, filed on Mar. 15, 2005.

(51) Int. Cl.
*H04B 1/00* (2006.01)
*H04B 15/00* (2006.01)

(52) U.S. Cl. ............ 455/63.1; 455/73; 455/114.3; 375/296

(58) Field of Classification Search ........ 455/63.1, 455/73, 126, 232.1, 127, 234.1, 522, 114.3; 375/296
See application file for complete search history.

(56) References Cited

U.S. PATENT DOCUMENTS

| | | | |
|---|---|---|---|
| 6,091,941 A | * | 7/2000 | Moriyama et al. ......... 455/126 |
| RE37,407 E | * | 10/2001 | Eisenberg et al. ............. 330/2 |
| 6,366,177 B1 | | 4/2002 | McCune et al. |
| 6,377,784 B2 | | 4/2002 | McCune |
| 6,801,086 B1 | | 10/2004 | Chandrasekaran |
| 7,010,276 B2 | | 3/2006 | Sander et al. |
| 7,158,494 B2 | | 1/2007 | Sander et al. |
| 7,190,222 B2 | * | 3/2007 | Okazaki et al. ............ 330/149 |
| 2002/0009162 A1 | * | 1/2002 | Camp et al. ................ 375/329 |

* cited by examiner

*Primary Examiner*—Nay Maung
*Assistant Examiner*—Tuan H Nguyen
(74) *Attorney, Agent, or Firm*—Withrow & Terranova, P.L.L.C.

(57) ABSTRACT

A method is provided for calibrating Amplitude Modulation to Phase Modulation (AM/PM) predistortion coefficients for a polynomial used to compensate for AM/PM distortion of a power amplifier in the transmit chain of a mobile terminal. In general, the power amplifier is controlled by a variable supply voltage, which is generated based on an adjustable power control signal. After the power amplifier is placed in the mobile terminal, a predetermined data pattern is transmitted in a transmit burst. During the transmit burst, the variable supply voltage is changed from a first value to a second value, and a resultant phase shift in the radio frequency output signal provided by the mobile terminal is measured. Based on the phase shift, one of numerous predetermined sets of AM/PM predistortion coefficients is selected as the AM/PM coefficients for the mobile terminal.

11 Claims, 7 Drawing Sheets

METHOD OF IN-DEVICE PHASE MEASUREMENT AND CORRELATION TO PROGRAMMABLE FACTORS

RELATED APPLICATIONS

This U.S. patent application claims the benefit of provisional patent application Ser. No. 60/661,957, filed Mar. 15, 2005, the disclosure of which is hereby incorporated by reference in its entirety.

FIELD OF THE INVENTION

The present invention relates to mobile terminals and more particularly relates to calibrating Amplitude Modulation to Phase Modulation (AM/PM) predistortion coefficients for a polynomial defining an AM/PM predistortion provided by a transmitter of a mobile terminal to compensate for AM/PM distortion of a power amplifier of the transmitter.

BACKGROUND OF THE INVENTION

In open-loop polar transmitters operating according to modulation schemes such as the Enhanced Data Rate for Global Evolution (EDGE) modulation scheme of the Global System for Mobile Communications (GSM) standard, a power amplifier in the transmit chain is typically non-linear. As a result of the non-linearity of the power amplifier, both Amplitude Modulation to Amplitude Modulation (AM/AM) and Amplitude Modulation to Phase Modulation (AM/PM) distortion are introduced in the system. In order to compensate for the AM/AM and AM/PM distortion of the power amplifier, it is desirable to predistort both amplitude and phase components of a transmit signal prior to amplification by the power amplifier.

One method of predistorting the amplitude and phase components is disclosed in commonly owned and assigned U.S. Patent Application Publication Number 2003/0215025, entitled AM TO PM CORRECTION SYSTEM FOR POLAR MODULATOR, published Nov. 20, 2003; and U.S. Patent Application Publication Number 2003/0215026, entitled AM TO AM CORRECTION SYSTEM FOR POLAR MODULATOR, published Nov. 20, 2003, which are both hereby incorporated herein by reference in their entireties. This method predistorts the amplitude and phase components using predetermined polynomials defining the desired predistortion. For example, coefficients for a third order polynomial defining the desired AM/PM predistortion as a function of the amplitude component may be predetermined. The third order polynomial is then used to provide a phase correction component as a function of the amplitude component which is added to the phase component and corrects the AM/PM distortion of the power amplifier.

The coefficients are typically determined by the manufacturer prior to placing the power amplifier in a mobile terminal, such as a mobile telephone or similar wireless communication device. However, one difficulty with this method is that the AM/PM distortion of the power amplifier changes once the power amplifier is placed into the mobile terminal. Thus, there remains a need for a method of calibrating the coefficients of the polynomial defining the desired AM/PM predistortion after the power amplifier is placed into the mobile terminal. In addition, there also remains a need for a method of calibrating the coefficients of the polynomial defining the desired AM/PM predistortion after the power amplifier is placed into the mobile terminal using existing test equipment.

SUMMARY OF THE INVENTION

The present invention provides a method for calibrating Amplitude Modulation to Phase Modulation (AM/PM) predistortion coefficients for a polynomial used to compensate for AM/PM distortion of a power amplifier in the transmit chain of a mobile terminal. In general, the power amplifier is controlled by a variable supply voltage, which is generated based on an adjustable power control signal. After the power amplifier is placed in the mobile terminal, a predetermined data pattern is transmitted in a transmit burst. During the transmit burst, the variable supply voltage is changed from a first value to a second value, and a resultant phase shift in the radio frequency output signal provided by the mobile terminal is measured. Based on the phase shift, one of numerous predetermined sets of AM/PM predistortion coefficients is selected as the AM/PM coefficients for the mobile terminal.

In one embodiment, the adjustable power control signal is generated based at least in part on combining a unity gain ramping signal defining the transmit burst and a power amplifier gain (PAG) setting controlling a gain of the power amplifier circuitry. In this embodiment, the variable supply voltage is changed from the first value to the second value during the transmit burst by changing the PAG setting from a first value to a second value.

In another embodiment, the adjustable power control signal is generated based at least in part on combining the unity gain ramping signal and the PAG setting. In this embodiment, the ramping signal is delayed by a predetermined time such that ramp-up for the transmit occurs during the transmit burst rather than at the beginning of the transmit burst. The adjustable power control signal is controlled such that the variable supply voltage is set to the first value prior to ramp-up and to the second value after ramp-up.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
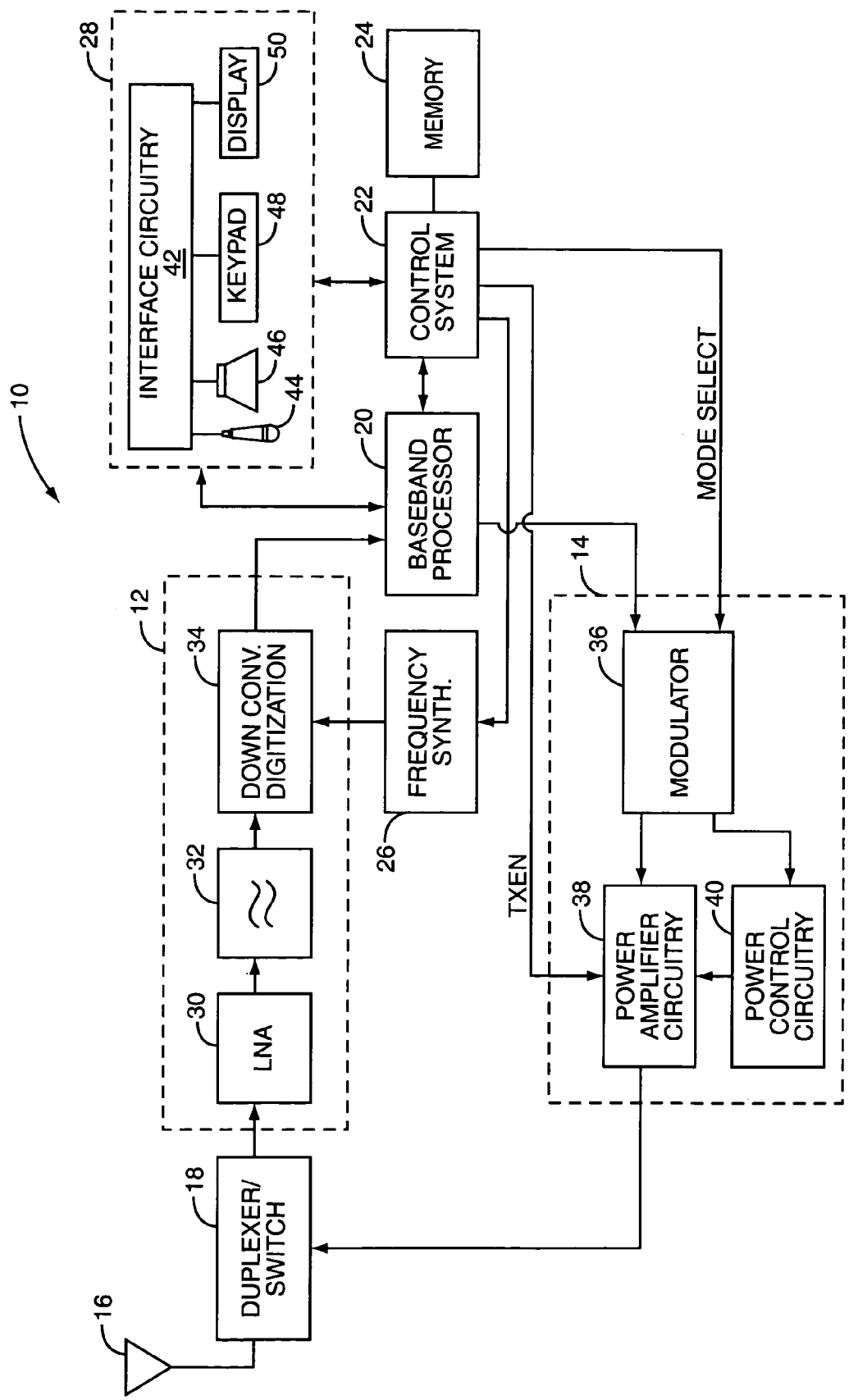
FIG. 1 illustrates an exemplary mobile terminal.

The present invention is preferably used to calibrate Amplitude Modulation to Phase Modulation (AM/PM) pre-distortion in a transmitter of a mobile terminal 10, such as a mobile telephone, personal digital assistant, wireless Local Area Network (LAN) device, a base station in a mobile network, or other wireless communication device. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood. After encoding the data from the control system 22, the baseband processor 20 outputs the encoded data to the radio frequency transmitter section 14.

A modulator 36 receives the data from the baseband processor 20 and operates according to one or more modulation schemes to provide a modulated signal to the power amplifier circuitry 38. The modulation scheme of the modulator 36 may be controlled by a mode select signal (MODE SELECT) from the control system 22. In one embodiment, the modulator 36 operates according to either an 8-Level Phase Shift Keying (8PSK) modulation scheme, which is a modulation scheme containing both amplitude and phase components, or a Gaussian Minimum Shift Keying (GMSK) modulation scheme, which is a constant amplitude modulation scheme.

When in 8PSK mode, the modulator 36 provides a phase component at a desired transmit frequency to the power amplifier circuitry 38 and an adjustable power control signal including an amplitude component to the power control circuitry 40. The power control circuitry 40 controls an output power of the power amplifier circuitry 38 based on adjustable power control signal. In one embodiment, the adjustable power control signal is the combination of a ramping signal, which defines a transmit burst, a power amplifier gain setting, and the amplitude component, thereby providing amplitude modulation of the phase component. The power amplifier gain setting, optionally a combination of the power amplifier gain setting and the ramping signal, may be provided to the modulator 36 from the control system 22.

When in GMSK mode, the modulator provides a phase modulated signal to the power amplifier circuitry 38 and an adjustable power control signal to the power control circuitry 40. However, in GMSK mode, the adjustable power control signal does not include an amplitude modulation component and may be a combination of the ramping signal and the power amplifier gain setting. Again, the power control circuitry 40 controls the output power of the power amplifier circuitry 38 based on the adjustable power control signal.

The power amplifier circuitry 38 amplifies the modulated signal from the modulator 36 to a level appropriate for transmission from the antenna 16. A gain of the power amplifier circuitry 38 is controlled by the power control circuitry 40. In essence, the power control circuitry 40 operates to control a supply voltage provided to the power amplifier circuitry 38 based on the adjustable power control signal from the modulator 36.

A user may interact with the mobile terminal 10 via the interface 28, which may include interface circuitry 42 associated with a microphone 44, a speaker 46, a keypad 48, and a display 50. The interface circuitry 42 typically includes analog-to-digital converters, digital-to-analog converters, amplifiers, and the like. Additionally, it may include a voice encoder/decoder, in which case it may communicate directly with the baseband processor 20.

The microphone 44 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 46 by the interface circuitry 42. The keypad 48 and display 50 enable the user to interact with the mobile terminal 10, input numbers to be dialed and address book information, or the like, as well as monitor call progress information.

Figure 2:
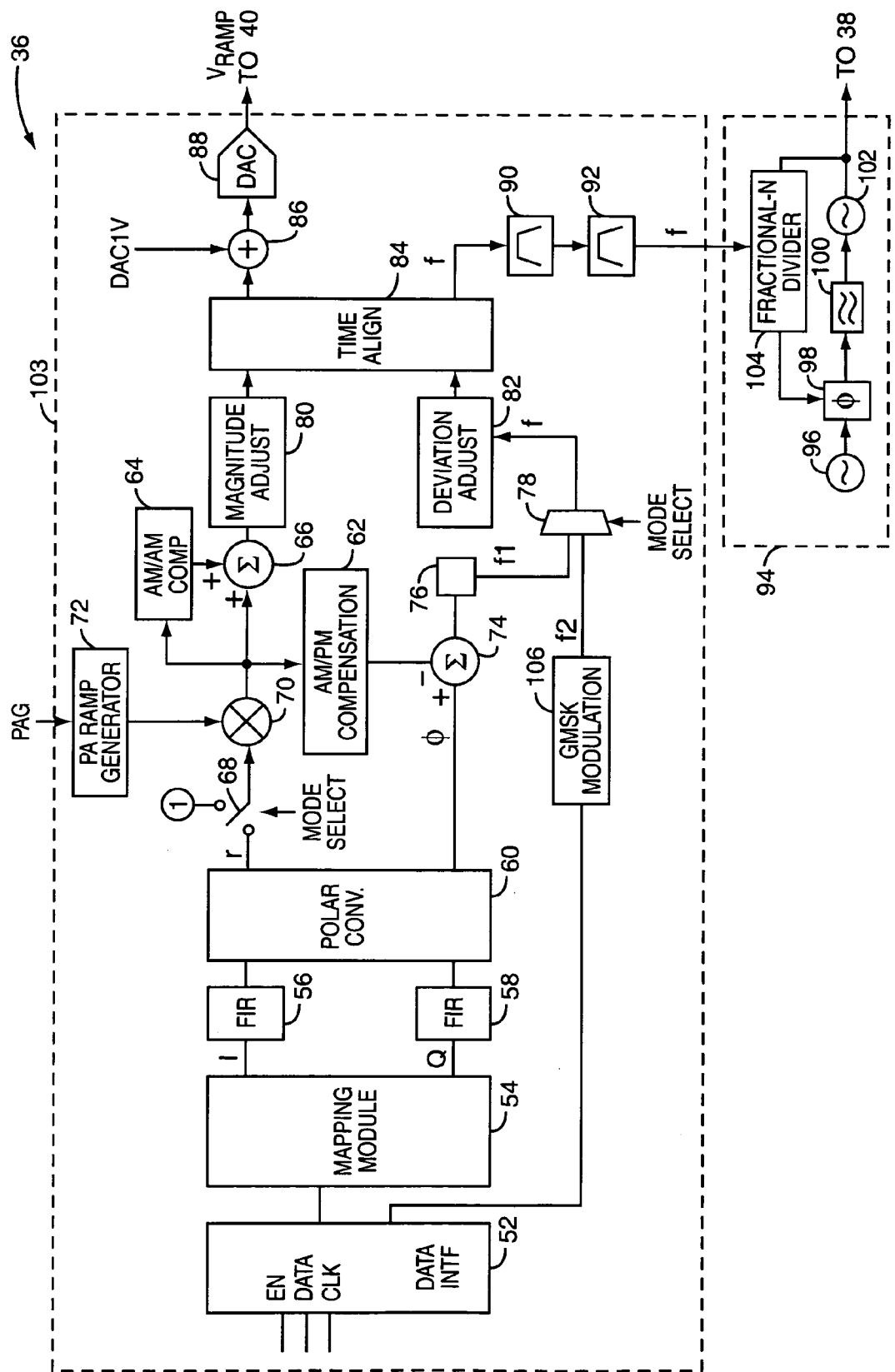
FIG. 2 illustrates a modulator according to one embodiment of the present invention.

FIG. 2 illustrates an exemplary embodiment of the modulator 36 wherein the modulator 36 operates in either an 8PSK (8-level Phase Shift Keying) mode or GMSK (Gaussian Minimum Shift Keying) mode. It should be noted that 8PSK and GMSK are exemplary modulation schemes and are not intended to limit the scope of the present invention. The modulator 36 includes several components, including a data interface 52, a mapping module 54, first and second filters 56, 58, and a polar converter 60. Other components of the modulator 36 will be discussed below. It should be noted that the data interface 52 may include First In First Out (FIFO) circuitry or may alternatively be a real time serial data interface.

The mapping module 54, the filters 56, 58, and the polar converter 60 form an 8PSK modulator. As discussed below, in this embodiment, the 8PSK modulator also includes Amplitude Modulation to Phase Modulation (AM/PM) compensation circuitry 62, Amplitude Modulation to Amplitude Modulation (AM/AM) compensation circuitry 64, and various other components as described below.

When in 8PSK mode, the data interface 52 receives data from the baseband processor 20 (FIG. 1) at the bit rate of the system. This data is passed to the mapping module 54, where the data is grouped into symbols of three consecutive data bits, Grey coded, and rotated by $3\pi/8$ on each symbol as per European Telecommunications Standards Institute (ETSI)

specifications. The resulting symbol is mapped to one of sixteen points in an in-phase (I), quadrature phase (Q) constellation.

Both the in-phase (I) and the quadrature phase (Q) components for each point are then filtered by the first and second filters 56, 58, respectively. In an exemplary embodiment, the first and second filters 56, 58 are EDGE finite impulse response (FIR) filters. This, as dictated by the ETSI specifications, shapes the response between symbol times.

After filtering, both the in-phase (I) and the quadrature phase (Q) components are sent to the polar converter 60. The polar converter 60 uses a classical coordinate rotation digital computer (CORDIC) algorithm or like rectangular to polar conversion technique. Thus, the polar converter 60 generates phase ($\phi$) and amplitude (r) equivalent signals. Further information about CORDIC algorithms may be found in *Proceedings of the* 1998 *ACM/SIGDA Sixth International Symposium On Field Programmable Gate Arrays* by Ray Andraka, Feb. 22-24, pp. 191-200 and "The CORDIC Trigonometric Computing Technique" by Jack E. Voider *IRE Trans on Elect. Computers*, p. 330, 1959, both of which are hereby incorporated by reference in their entireties.

The amplitude signal (r) is split and directed to the AM/PM compensation circuitry 62, the AM/AM compensation circuitry 64, and summation circuitry 66 via switch 68. The switch 68 is controlled by the mode select signal (MODE SELECT) such that the switch 68 couples the output of the polar converter 60 to a multiplier 70. The multiplier 70 combines the amplitude signal (r) with a ramping signal generated by a power amplifier (PA) ramp generator 72. The ramping signal is a combination of a unity gain ramping signal and a power amplifier gain (PAG) setting that controls the output power of the power amplifier circuitry 38. For example, the unity gain ramping signal may be multiplied by the PAG setting to provide the ramping signal. The PAG setting may be provided by the control system 22 (FIG. 1). Thereafter, the amplitude signal from the multiplier 70 is directed to the AM/PM compensation circuitry 62, the AM/AM compensation circuitry 64, and summation circuitry 66.

The AM/PM compensation circuitry 62 introduces a compensation term to the phase signal via subtraction circuitry 74 that, after further processing, counteracts the distortion introduced by AM to PM conversion in the power amplifier circuitry 38. The AM/AM compensation circuitry 64 introduces a compensation term to the amplitude signal via the summation circuitry 66 that, after further processing, counteracts the distortion introduced by AM to AM conversion in the power amplifier circuitry 38. Further details of the AM/PM compensation circuitry 62 and the AM/AM compensation circuitry 64 can be found in commonly owned and assigned U.S. Patent Application Publication No. 2003/0215025, entitled AM TO PM CORRECTION SYSTEM FOR POLAR MODULATOR, published Nov. 20, 2003; and U.S. Patent Application Publication No. 2003/0215026, entitled AM TO AM CORRECTION SYSTEM FOR POLAR MODULATOR, published Nov. 20, 2003, both of which have been incorporated herein by reference in their entireties.

The output of the subtraction circuitry 74, which is referred to herein as a combined signal, is directed to a phase to frequency converter 76. The output of the phase to frequency converter 76 is a frequency signal (f1), which generally corresponds to the desired frequency deviation of the modulated signal. The frequency signal (f1) is provided to a multiplexer switch 78, which is controlled by the mode select signal (MODE SELECT). When in the 8PSK mode, the mode select signal is provided such that the multiplexer switch 78 outputs the frequency signal (f1) from the phase to frequency converter 76. Magnitude adjuster 80 and deviation adjuster 82 then adjust the magnitude of the amplitude signal (r) and the frequency deviation of the frequency signal (f), respectively, to a level expected by a time aligner 84, such that they comply with the appropriate standard. Next, a relative time delay is applied as necessary to the signals for best Error Vector Magnitude (EVM) and spectrum by the time aligner 84, such that the time aligner 84 provides the amplitude signal (r) and a frequency signal (f). The frequency signal (f) is a magnitude adjusted, time aligned version of the output of the multiplexer switch 78. Because these are preferably digital components, concerns about variations in analog components and the corresponding variation in time delays downstream are minimized.

At this point, the amplitude signal (r) and the frequency signal (f) separate and proceed by different paths, an amplitude signal processing path and a frequency signal processing path, to the power amplifier circuitry 38. With respect to the amplitude signal processing path, when in the 8PSK mode, the amplitude signal (r) is provided to a summation node 86 where it is combined with a controllable DC offset (DAC1V). Note that the summation node 86 may be placed essentially anywhere in the amplitude path between the polar converter 60 and digital-to-analog (D/A) converter 88. The D/A converter 88 converts the digital amplitude signal (r) from the summation node 86 to an analog power control signal, which is referred to herein as an adjustable power control signal ($V_{RAMP}$). The adjustable power control signal ($V_{RAMP}$) is used by the power control circuitry 40 to set the collector voltage on the power amplifier circuitry 38. As the adjustable power control signal ($V_{RAMP}$) changes, the voltage at the power amplifier circuitry 38 collector changes, and the output power will vary as $V^2/R_{out}$ ($R_{out}$ is not shown, but is effectively the load on the power amplifier circuitry 38). This is sometimes known as "plate modulation".

The frequency signal (f) from the time aligner 84 is directed to a digital filter 90 and a digital predistortion filter 92. Thereafter, the frequency signal (f), which is a digital signal, is provided to a phase locked loop (PLL) 94 to provide direct digital modulation similar to that described in commonly owned and assigned U.S. Pat. No. 6,834,084, entitled DIRECT DIGITAL POLAR MODULATOR, issued Dec. 21, 2004, which is hereby incorporated herein by reference in its entirety. In one embodiment, the data interface 52 provides a digital data interface to the baseband processor 20, and the entire phase path from the data interface 52 to the PLL 94 is a digital path.

Based on the frequency signal (f), the PLL 94 generates an output at the desired radio frequency. In the exemplary embodiment illustrated, the PLL 94 includes a reference oscillator 96, a phase detector 98, a loop filter 100, a voltage controlled oscillator (VCO) 102, and a fractional-N divider 104. The operational details of the PLL 94 will be apparent to one of ordinary skill in the art upon reading this disclosure. In general, the phase detector 98 compares a phase of a reference signal provided by the reference oscillator 96 with a divided signal provided by the fractional-N divider 104. Based on the comparison of the reference signal and the divided signal, the phase detector 98 provides a detection signal to the loop filter 100. The loop filter 100, which is a low pass filter, operates to filter the detection signal to provide a control signal to the VCO 102.

The modulator 36 also includes a GMSK modulator, which includes the GMSK modulation circuitry 106. When in GMSK mode, the GMSK modulation circuitry 106 processes the data to generate a frequency signal (f2). In one embodiment, the GMSK modulation circuitry 106 is a look-up table.

Another exemplary embodiment of the GMSK modulation circuitry 106 is discussed in U.S. Pat. No. 5,825,257, entitled GMSK MODULATOR FORMED OF PLL TO WHICH CONTINUOUS MODULATED SIGNAL IS APPLIED, issued Oct. 20, 1998, which is hereby incorporated by reference in its entirety. It should be appreciated that other embodiments of the GMSK modulation circuitry 106 may also be used, and the particular circuitry is not central to the present invention.

The output of the GMSK modulation circuitry 106, which is the frequency signal (f2), is provided to the multiplexer switch 78. In GMSK mode, the multiplexer switch 78 outputs the frequency signal (f2) from the GMSK modulation circuitry 106. As discussed above, the adjusters 80, 82 then adjust the magnitude of the amplitude signal (r) and the deviation of the frequency signal (f2), respectively, to levels expected by the time aligner 84, such that they comply with the appropriate standard. Next, a relative time delay is applied as necessary to the signals for best Error Vector Magnitude (EVM) and spectrum by the time aligner 84.

At this point, the amplitude signal (r) and the frequency signal (f) output by the time aligner 84 separate and proceed by different paths to the power amplifier circuitry 38. With respect to the amplitude signal processing path, when in the GMSK mode, the switch 68 is controlled such that a unity signal is provided to the multiplier 70. Accordingly, the multiplier 70 multiplies the ramping signal from the PA ramp generator 72 by 1 to provide the amplitude signal processed by the AM/AM compensation circuitry 64, the summation circuitry 66, the magnitude adjuster 80, and the time aligner 84 to provide the amplitude signal (r), which is also referred to as a digital power control signal. The digital power control signal is converted to the analog adjustable power control signal ($V_{RAMP}$) by the digital-to-analog converter 88. The adjustable power control signal ($V_{RAMP}$) is used by the power control circuitry 40 to set the collector voltage on the power amplifier circuitry 38.

As in 8PSK mode, when in GMSK mode, the frequency signal (f) from the time aligner 84 is directed to the digital filter 90, the optional digital predistortion filter 92, and the PLL 94. The PLL 94 generates the output at the desired radio frequency. In an exemplary embodiment, the frequency signal is applied to a single port on the fractional-N divider 104 within the PLL 94.

Figure 3:
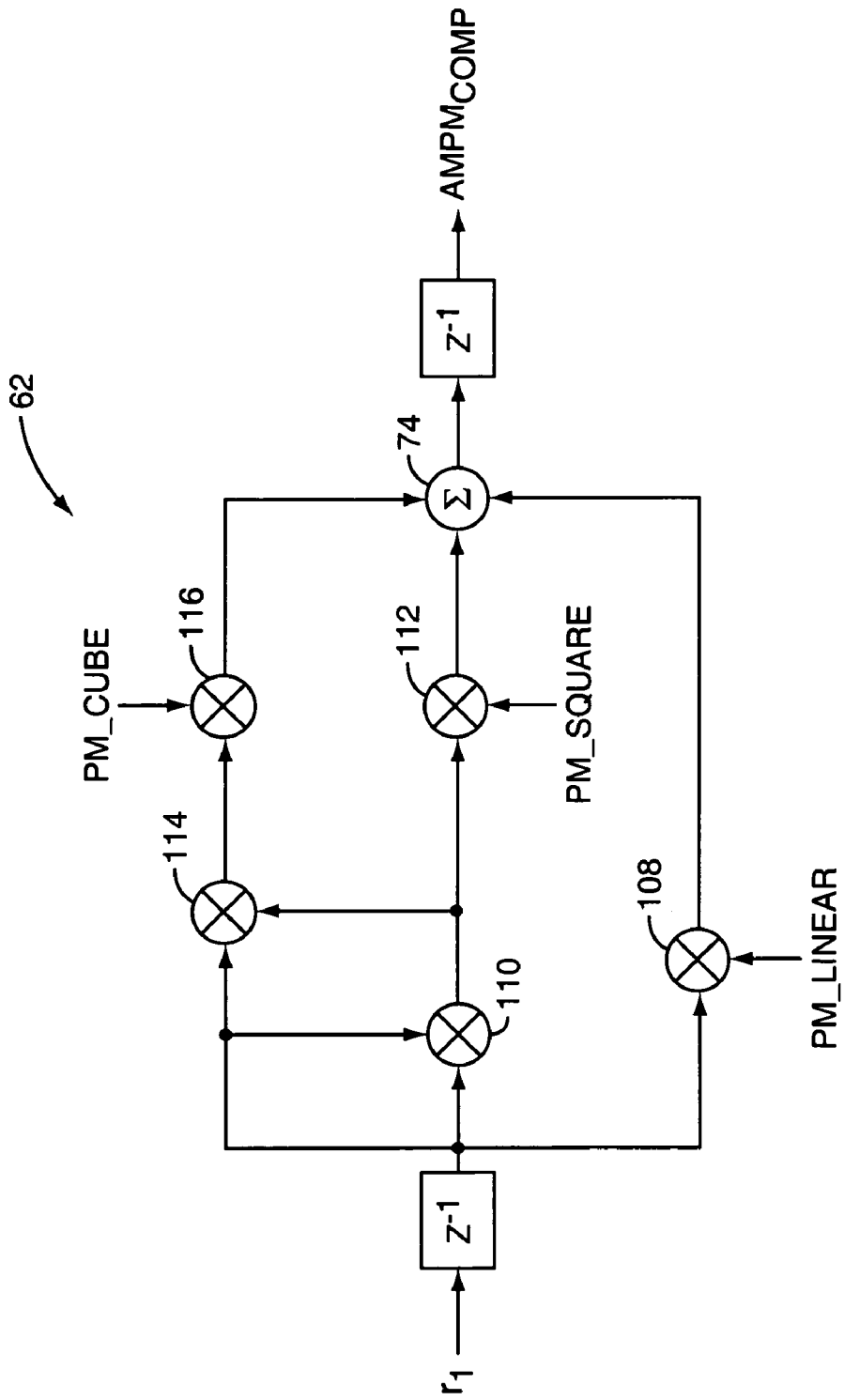
FIG. 3 illustrates an exemplary embodiment of the Amplitude Modulation to Phase Modulation (AM/PM) compensation circuitry of the modulator of FIG. 2 according to one embodiment of the present invention.

FIG. 3 illustrates an exemplary embodiment of the AM/PM compensation circuitry 62. In general, in this embodiment, the AM/PM compensation circuitry 62 operates to provide an AM/PM compensation signal to the subtraction circuitry 74 (FIG. 2) according to the following equation:

$$AMPM_{COMP} = PM\_CUBE \cdot r_{IN}^3 + PM\_SQUARE \cdot r_{IN}^2 + PM\_LINEAR \cdot r_{IN},$$

where $AMPM_{COMP}$ is the AM/PM compensation signal provided to the subtraction circuitry 74 (FIG. 2), $r_{IN}$ is the amplitude signal from multiplier 70 (FIG. 2) or optionally from the output of the AM/AM compensation circuitry 64 (FIG. 2). PM_CUBE, PM_SQUARE, and PM_LINEAR are predetermined coefficients that defined the desired AM/PM predistortion and may be stored in memory 24 (FIG. 1). As illustrated, the exemplary AM/PM compensation circuitry 62 includes multipliers 108-116 arranged as shown. The multiplier 108 produces the linear term PM_LINEAR·$r_{IN}$; the multipliers 110 and 112 produce the square term PM_SQUARE·$r_{IN}^2$; and the multipliers 114 and 116 produce the cubic term PM_CUBE $r_{IN}^3$.

The AM/PM distortion of the power amplifier circuitry 38 (FIG. 1) changes depending on the particular mobile terminal 10 into which it is placed. Thus, it is desirable to calibrate the coefficients PM_CUBE, PM_SQUARE, and PM_LINEAR after the power amplifier circuitry 38 is placed into the mobile terminal 10. In addition, it is desirable to calibrate the coefficients PM_CUBE, PM_SQUARE, and PM_LINEAR using existing equipment such as a Rhode and Schwartz CMU200.

The present invention provides a method for calibrating the coefficients PM_CUBE, PM_SQUARE, and PM_LINEAR after the power amplifier circuitry 38 (FIG. 1) is placed into the mobile terminal 10 (FIG. 1) by increasing the adjustable power control signal ($V_{RAMP}$), and thus a variable supply voltage controlling the output power of the power amplifier circuitry 38, from a first value, such a 0.45 V, to a second value, such as 1 V, and measuring a resultant phase shift in the output of the power amplifier circuitry 38. Based on the measured phase shift, one of numerous predetermined sets of values for the coefficients PM_CUBE, PM_SQUARE, and PM_LINEAR is selected and stored in memory 24.

Figure 4:
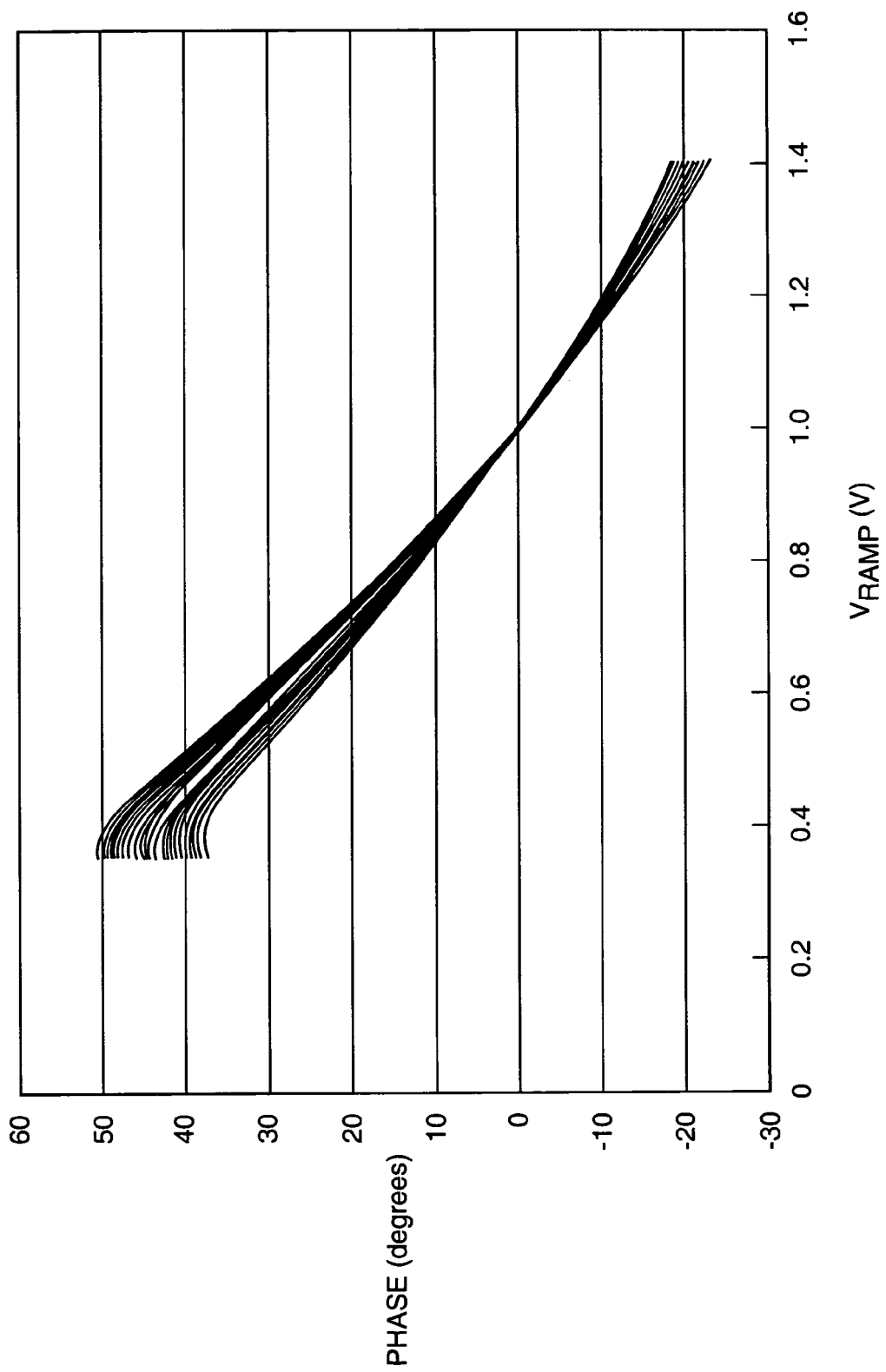
FIG. 4 is a graphical illustration of the AM/PM distortion of numerous power amplifiers prior to being placed in a mobile terminal.

First, the predetermined sets of values for the coefficients PM_CUBE, PM_SQUARE, and PM_LINEAR are determined using numerous power amplifier circuits 38. FIG. 4 illustrates the AM/PM distortion as a function of the adjustable power control signal ($V_{RAMP}$) for numerous power amplifier circuits 38 (FIG. 1) manufactured using a particular manufacturing process. As illustrated, even though the power amplifier circuits 38 are manufactured using the same manufacturing process, the AM/PM distortion curves may vary.

According to the present invention, the power amplifier circuits 38 are grouped into two or more groups based on a measured phase shift caused by changing the adjustable power control signal ($V_{RAMP}$), and thus the variable supply voltage controlling the output power of the power amplifier circuitry 38, from a first value, such as 0.45 V, to a second value, such as 1 V. For example, referring again to FIG. 4, the power amplifier circuits 38 may be separated into two groups, wherein the phase shift is 35 to 40 degrees for the first group and 40 to 45 degrees for the second group. For each of the groups, a set of values for the coefficients PM_CUBE, PM_SQUARE, and PM_LINEAR is determined.

Figure 5:
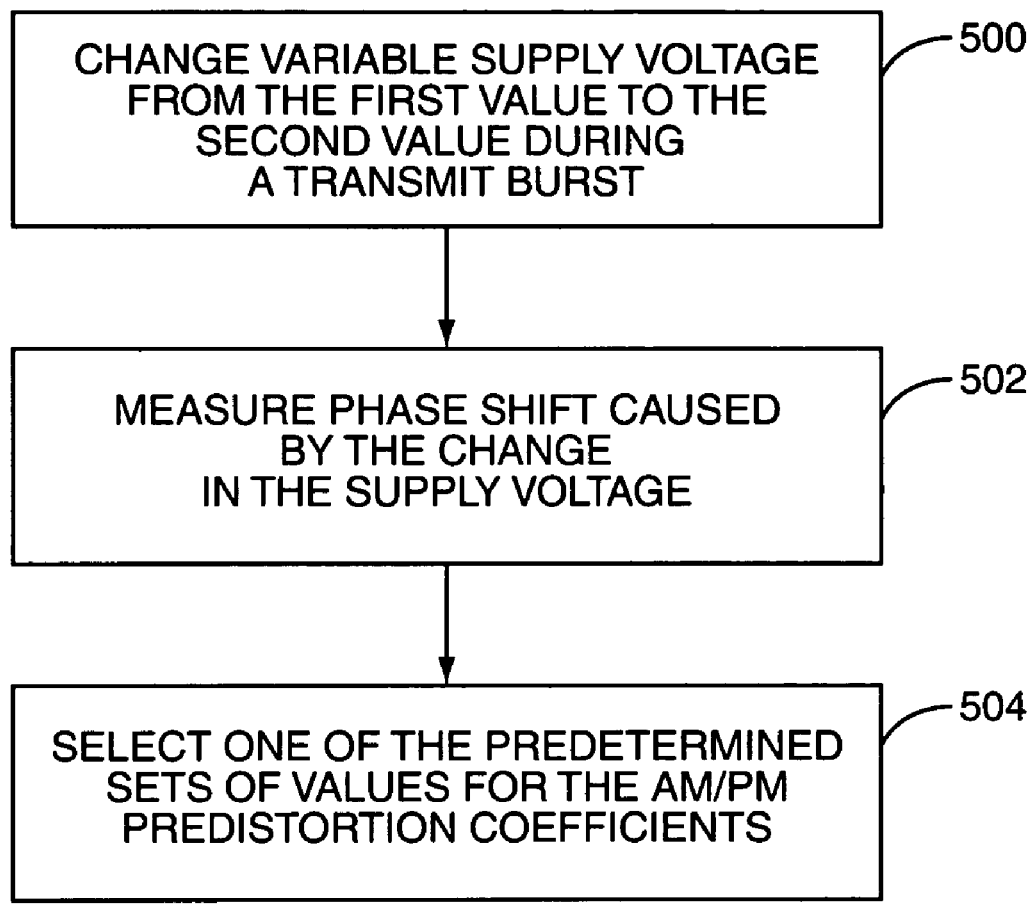
FIG. 5 illustrates a method for calibrating coefficients of a polynomial defining the desired AM/PM predistortion provided by the AM/PM compensation circuitry of FIG. 2 according to one embodiment of the present invention.

FIG. 5 illustrates a method for calibrating the coefficients PM_CUBE, PM_SQUARE, and PM_LINEAR after the power amplifier circuitry 38 is placed into the mobile terminal 10. The variable supply voltage provided to the power amplifier circuitry 38 by the power control circuitry 40 is changed from the first value, such as 0.45 V, to the second value, such as 1 V, during a transmit burst (step 500). As discussed below, in one embodiment, this is done by changing the PAG setting from a first value to a second value during the transmit burst. In another embodiment, this is done by delaying ramp-up such that it occurs during the transmit burst rather than at the beginning of the transmit burst. The phase shift caused by the change in the variable supply voltage is then measured (step 502). Based on the measured phase shift, one of the sets of predetermined values for the coefficients PM_CUBE, PM_SQUARE, and PM_LINEAR is selected and stored in the memory 24 (FIG. 1) of the mobile terminal 10 (step 504).

Figure 6:
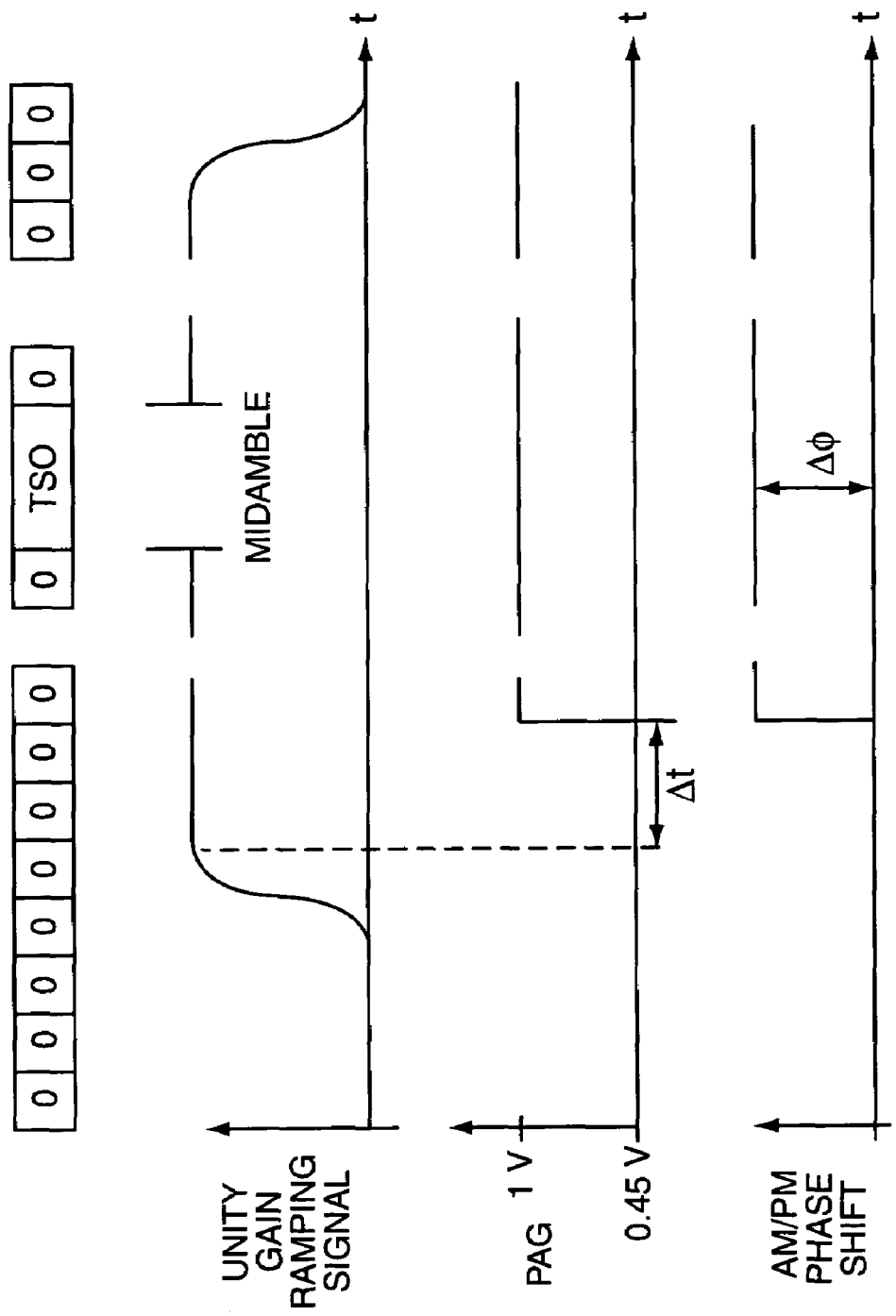
FIG. 6 illustrates a first method for measuring a phase shift of FIG. 5 after the power amplifier is placed in a mobile terminal.

FIG. 6 is a graphical illustration of a first method of measuring the phase shift after the power amplifier circuitry 38 is placed in the mobile terminal 10 according to the present invention. In this embodiment, the mobile terminal 10 operates according to the GSM standard, and the modulator 36 (FIG. 1) provides either 8PSK or GMSK modulation. After the power amplifier circuitry 38 is placed into the mobile terminal 10, the modulator 36 is set to GMSK mode and a data pattern of all zeros is transmitted. A training sequence, such as TS0 of the GSM standard, is provided in the data pattern at the center of the transmit burst. Prior to the transmit burst, the PAG setting is set to 0.45 V. After a predetermined time (Δt) after ramp-up, the PAG setting is increased to 1 V. Note that the transition in the PA setting occurs during the transmit burst after ramp-up and before the training sequence. Alternatively, the transition in the PAG setting could occur after the training sequence and before ramp-down.

Test equipment, such as a Rhode and Schwartz CMU200, is synchronized to the training sequence and used to measure the phase difference (Δϕ), or relative phase shift, due to the transition in the PAG setting. Based on the measured phase difference, one of the sets of predetermined values are selected as for the coefficients PM_CUBE, PM_SQUARE, and PM_LINEAR and stored in the memory 24 of the mobile terminal 10 (FIG. 1).

Figure 7:
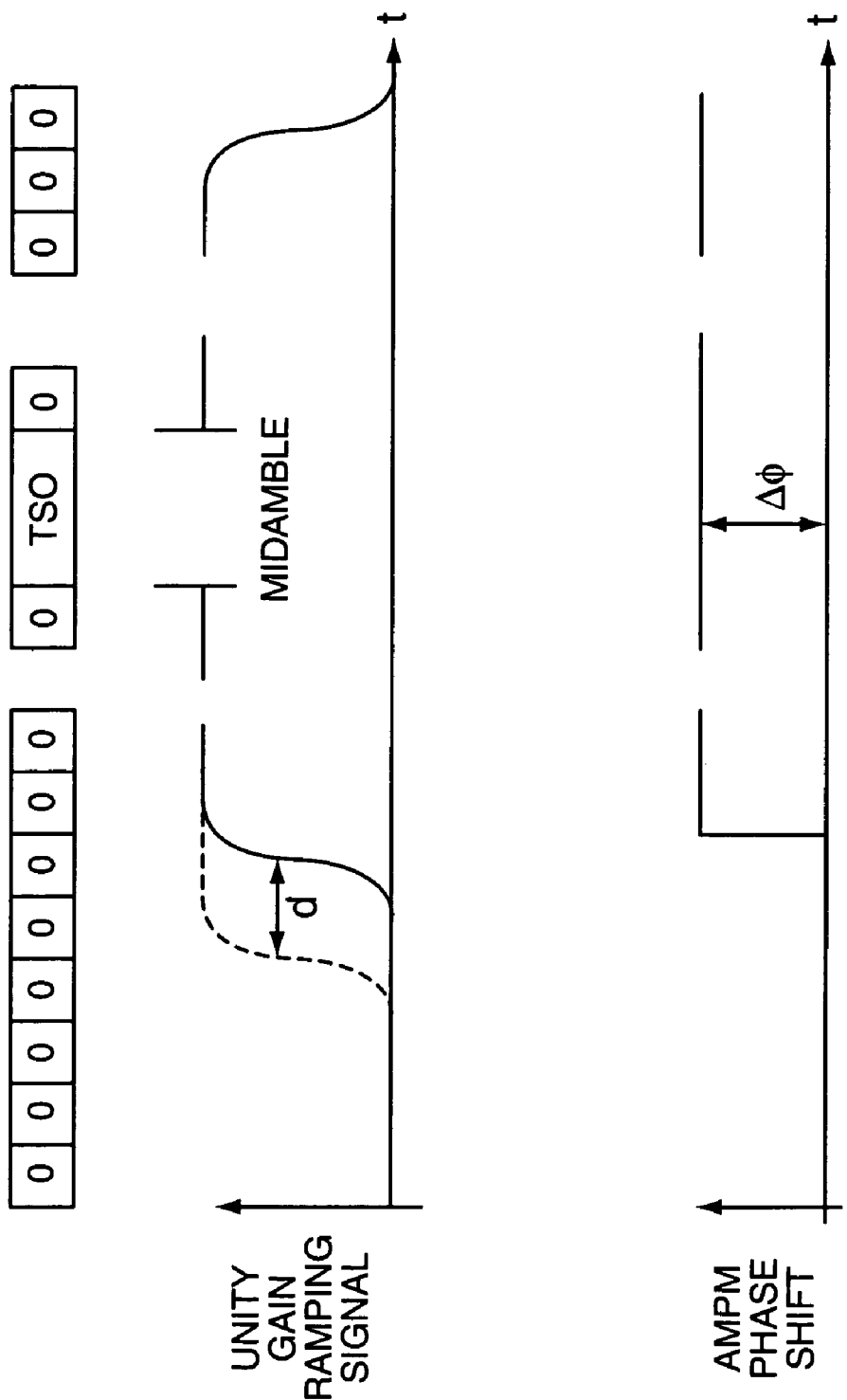
FIG. 7 illustrates a second method for measuring the phase shift of FIG. 5 after the power amplifier is placed in a mobile terminal.

FIG. 7 is a graphical illustration of a second method of measuring the phase shift after the power amplifier circuitry 38 is placed in the mobile terminal 10 according to the present invention. In this embodiment, rather than using the PAG setting, the adjustable power control signal ($V_{RAMP}$) is set to the first value, such as 0.45 V, using the DC offset (DAV1V) (FIG. 2) prior to the transmit burst. The data pattern is set to all zeros other than the training sequence to be transmitted at the center of the transmit burst. Next, the data pattern is transmitted while the modulator 36 (FIG. 1) is set to GMSK mode. However, rather than ramping up at the beginning of the transmit burst as usual, ramp-up is delayed by a predetermined delay (d) such that ramp-up occurs at a point in time between the beginning of the transmit burst and the training sequence. Further, the PAG setting is selected such that the adjustable power control signal ($V_{RAMP}$) ramps up from the first value, such as 0.45 V, controlled by the DC offset (DAC1V) to the second value, such as 1 V.

Again, test equipment, such as a Rhode and Schwartz CMU200, is synchronized to the training sequence and used to measure the phase difference (Δϕ), or relative phase shift, due to the transition in the PAG setting. Based on the measured phase difference, one of the sets of predetermined values are selected as for the coefficients PM_CUBE, PM_SQUARE, and PM_LINEAR and stored in the memory 24 (FIG. 1) of the mobile terminal.

In either of the embodiments of FIGS. 6 and 7, the test equipment may be used to directly determine the phase difference (Δϕ). Alternatively, phase versus time data may be obtained from the test equipment. This data typically includes noise. In order to average out this noise, a first line may be fit to the data before the phase shift, and a second line may be fit to the data after the phase shift. Then, the phase difference (Δϕ) may be computed by computing the difference between a point on the first line near the phase shift and a point on the second line near the phase shift. Alternatively, test equipment such as the Rhode and Schwartz CMU200 interprets the phase difference (Δϕ) as a frequency error and attempts to compensate for the frequency error. Thus, the second line fit to the data after the phase shift will have a slope proportional to the frequency error. The slope of the second line may then be computed and used to determine the phase difference (Δϕ).

Those skilled in the art will recognize improvements and modifications to the preferred embodiments of the present invention. All such improvements and modifications are considered within the scope of the concepts disclosed herein and the claims that follow.

What is claimed is:

1. A method for calibrating Amplitude Modulation to Phase Modulation (AM/PM) predistortion of a transmitter of a mobile terminal comprising:
    transmitting a predetermined data pattern in a transmit burst to provide an output signal;
    changing a variable supply voltage controlling an output power of power amplifier circuitry of the transmitter from a first value to a second value during the transmit burst;
    measuring a phase shift caused by changing the variable supply voltage to the second value, wherein the phase shift is a phase shift between a phase of the output signal before changing the variable supply voltage to the second value and a phase of the output signal after changing the variable supply voltage to the second value; and
    selecting one of a plurality of predetermined sets of AM/PM predistortion coefficients as AM/PM predistortion coefficients defining the AM/PM predistortion of the transmitter of the mobile terminal based on the phase shift.

2. The method of claim 1 wherein the predetermined data pattern includes a training sequence defining a center of the transmit burst, and measuring the phase shift comprises synchronizing external test equipment to the training sequence.

3. The method of claim 2 wherein the predetermined data pattern is all zeros except for the training sequence.

4. The method of claim 2 wherein changing the variable supply voltage from the first value to the second value comprises changing the variable supply voltage from the first value to the second value at a predetermined time between the beginning of the transmit burst and the training sequence.

5. The method of claim 2 wherein changing the variable supply voltage from the first value to the second value comprises changing the variable supply voltage from the first value to the second value at a predetermined time after the training sequence and before the end of the transmit burst.

6. The method of claim 1 further comprising providing the variable supply voltage based on an adjustable power control signal and providing the adjustable power control signal based at least in part on a power amplifier gain setting, wherein changing the variable supply voltage from the first value to the second value comprises changing the power amplifier gain setting from a first power amplifier gain setting to a second power amplifier gain setting such that the adjustable power control signal is provided to change the variable supply voltage from the first value to the second value.

7. The method of claim 1 further comprising providing the variable supply voltage based on an adjustable power control signal, wherein changing the variable supply voltage from the first value to the second value comprises:
    providing the adjustable power control signal such that the variable supply voltage is set to the first value prior to the beginning of the transmit burst; and
    increasing the adjustable power control signal after a predetermined delay from the beginning of the transmit burst such that the variable supply voltage is ramped up from the first value to the second value during the transmit burst.

8. The method of claim 1 further comprising providing the variable supply voltage based on an adjustable power control signal, wherein changing the variable supply voltage from the first value to the second value comprises:
    delaying ramp-up for the transmit burst a predetermined time from the beginning of the transmit burst such that ramp-up occurs during the transmit burst; and
    increasing the adjustable power control signal to effectuate ramp-up after the predetermined time from the beginning of the transmit burst such that the variable supply voltage increases from the first value to the second value.

9. The method of claim 1 wherein the first value of the variable supply voltage is 0.45 V and the second value of the variable supply voltage is 1 V.

10. The method of claim 1 wherein setting the variable supply voltage to the first value, changing the variable supply voltage to the second value, measuring the phase shift, and selecting one of the plurality of predetermined sets of AM/PM predistortion coefficients each occur after the power amplifier circuitry is placed into the mobile terminal.

11. The method of claim 1 further comprising:
measuring the phase shift caused by changing the variable supply voltage to the second value for each of a plurality of power amplifier circuitries;

dividing the plurality of power amplifier circuitries into a number of groups based on the phase shift; and determining the plurality of predetermined sets of the AM/PM predistortion coefficients by determining one of the plurality of predetermined sets of AM/PM predistortion coefficients for each of the number of groups of the plurality of power amplifier circuitries.

* * * * *